United States Patent [19]

Levinstein et al.

[11] 4,427,516

[45] Jan. 24, 1984

[54] APPARATUS AND METHOD FOR PLASMA-ASSISTED ETCHING OF WAFERS

[75] Inventors: Hyman J. Levinstein; Frederick Vratny, both of Berkeley Heights, N.J.

[73] Assignee: Bell Telephone Laboratories, Incorporated, Murray Hill, N.J.

[21] Appl. No.: 471,901

[22] Filed: Mar. 4, 1983

Related U.S. Application Data

[63] Continuation of Ser. No. 295,650, Aug. 24, 1981, abandoned.

[51] Int. Cl.³ .............................................. C23C 15/00
[52] U.S. Cl. ................................ 204/192 E; 156/345; 156/643; 204/298
[58] Field of Search ........................... 204/192 E, 298; 156/345, 643

[56] References Cited

U.S. PATENT DOCUMENTS

| | | | |
|---|---|---|---|
| 4,022,928 | 5/1977 | Piwcyzk | 204/192 R |
| 4,268,374 | 5/1981 | Lepselter | 204/192 E |
| 4,298,443 | 11/1981 | Maydan | 204/192 E |

FOREIGN PATENT DOCUMENTS

| | | |
|---|---|---|
| 54-14679 | 3/1979 | Japan . |
| 54-162269 | 12/1979 | Japan . |

*Primary Examiner*—Arthur P. Demers
*Attorney, Agent, or Firm*—Lucian C. Canepa

[57] ABSTRACT

In a plasma-assisted etching apparatus and method designed to pattern silicon dioxide in a plasma derived from a mixture of trifluoromethane and ammonia, surfaces in the reaction chamber are coated with a layer of silicon. Contamination of wafers during the etching process is thereby substantially reduced. In practice, this leads to a significant increase in the yield of acceptable chips per wafer.

14 Claims, 3 Drawing Figures

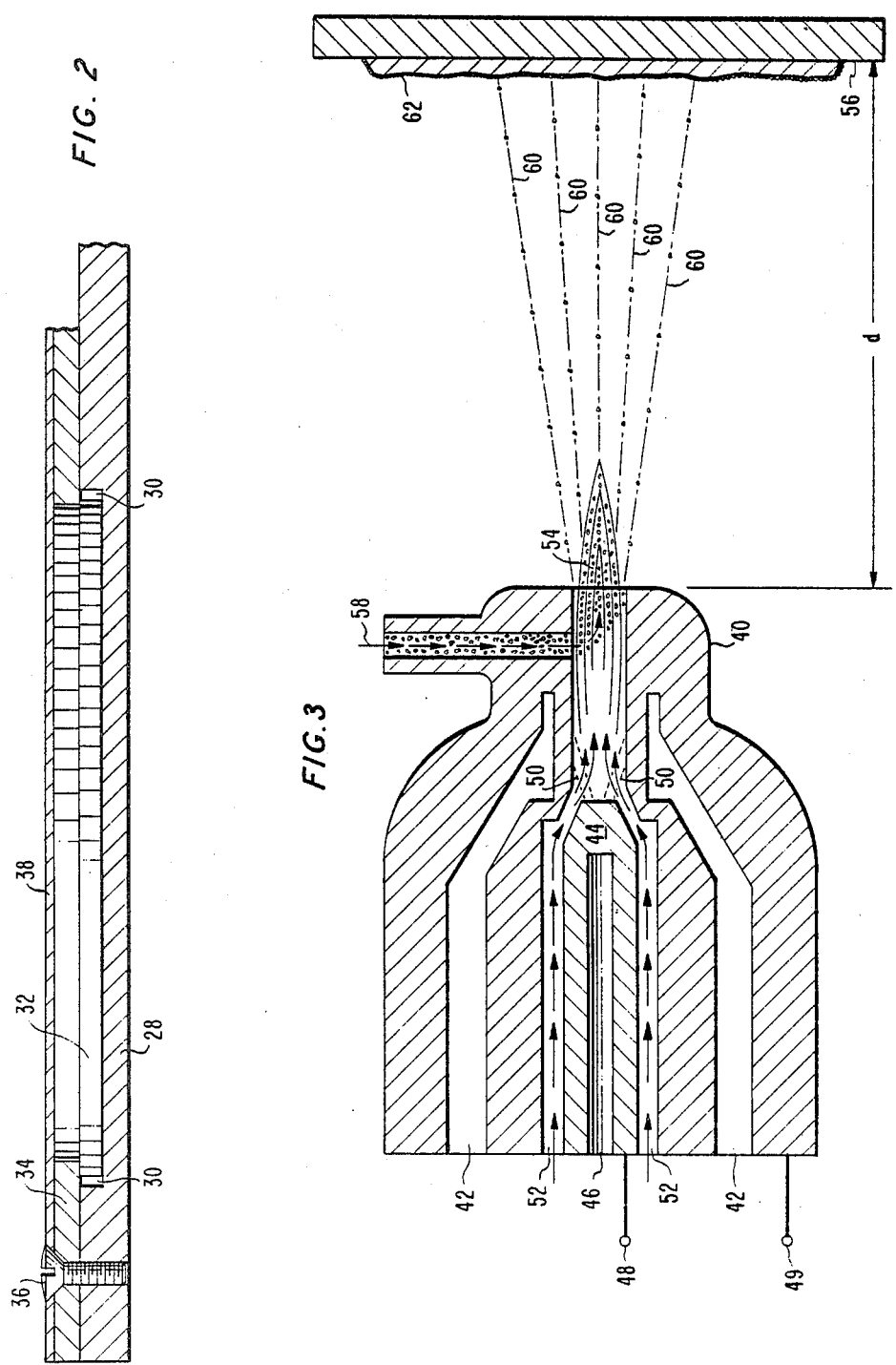

APPARATUS AND METHOD FOR PLASMA-ASSISTED ETCHING OF WAFERS

This application is a continuation of application Ser. No. 295,650, filed Aug. 24, 1981, now abandoned.

BACKGROUND OF THE INVENTION

This invention relates to the fabrication of microminiature devices and, more particularly, to an apparatus and a method in which fine-line patterns for integrated circuits are precisely delineated by dry etching processes.

Considerable interest exists in employing dry processing techniques for patterning workpieces such as semiconductor wafers. The interest in dry processing stems from its generally better resolution and improved dimensional and shape control capabilities relative to standard wet etching. Thus, dry etching is being utilized increasingly for, for example, fine-line pattern delineation in the processing of semiconductor wafers to form very large-scale-integrated (VLSI) devices.

Various dry etching processes that involve radio-frequency (rf)-generated plasmas in a reaction chamber are known. These so-called plasma-assisted processes include reactive sputter (or ion) etching. In reactive sputter etching, the workpieces to be patterned are placed on the rf-driven cathode electrode in the reaction chamber. In another plasma-assisted process, typically referred to as plasma etching, the workpieces are placed on the grounded anode electrode in the reaction chamber. These and other processes suitable for making VLSI devices are described by, for example, C. M. Melliar-Smith and C. J. Mogab in "Plasma-Assisted Etching Techniques for Pattern Delineation," *Thin Film Processes*, edited by J. L. Vossen and W. Kern, Academic Press, New York, 1978, pages 497 to 552.

As heretofore practised, plasma-assisted etching processes designed to pattern micron and sub-micron features in VLSI devices have often been plagued with relatively poor yield characteristics. One major obstacle to achieving better results in these processes has been the seemingly unavoidable presence of contaminants in the reaction chamber of the etching apparatus. These contaminants constitute, for example, pieces of material etched away from various surfaces in the reaction chamber or chemical fragments that are generated in the chamber during etching. Such contaminants can, for example, deposit on the surface of a selectively masked layer to be etched and thereby effectively inhibit etching of the unmasked portions of the layer that underlie the deposited contaminants. As a result, the pattern etched in the contaminated layer may not be a precise reproduction of the pattern formed in the overlying mask. In many cases of practical importance, the portions of the layer that are prevented by contaminants from being etched away result in unacceptable patterns being delineated in the devices under fabrication. Or some of these unetched portions, constituting slivers or so-called "grass" regions, may break off or be transported laterally or penetrate subsequent layers during the device fabrication sequence, thereby causing faults in the devices.

For these and other reasons, considerable efforts have been directed by workers in the art aimed at trying to reduce contamination effects in the reaction chamber of a plasma-assisted etching apparatus. It was recognized that such efforts, if successful, would increase the yield and thereby decrease the cost of devices made in accordance with a fabrication sequence that includes dry patterning steps carried out in such etching apparatus.

SUMMARY OF THE INVENTION

Hence, an object of the present invention is an improved etching apparatus and method. More specifically, an object of this invention is a plasma-assisted etching apparatus and method characterized by low contamination in the reaction chamber of the apparatus during the etching process.

Briefly, these and other objects of the present invention are realized in a specific illustrative plasma-assisted etching apparatus and method designed to pattern silicon dioxide in a plasma derived from trifluoromethane and ammonia. In accordance with a feature of the invention, at least some of the surfaces in the reaction chamber of the apparatus are coated with a layer of silicon. Contamination of wafers during the etching process is thereby substantially reduced.

BRIEF DESCRIPTION OF THE DRAWING

A complete understanding of the present invention and of the above and other features thereof may be gained from a consideration of the following detailed description presented hereinbelow in connection with the accompanying drawing, in which:

FIG. 2 is a cross-sectional depiction of a portion of the FIG. 1 apparatus;

and FIG. 3 is a cross-sectional schematic representation of a conventional plasma spray gun by means of which selected surfaces of the FIG. 1 apparatus may be coated.

DETAILED DESCRIPTION

Figure 1:
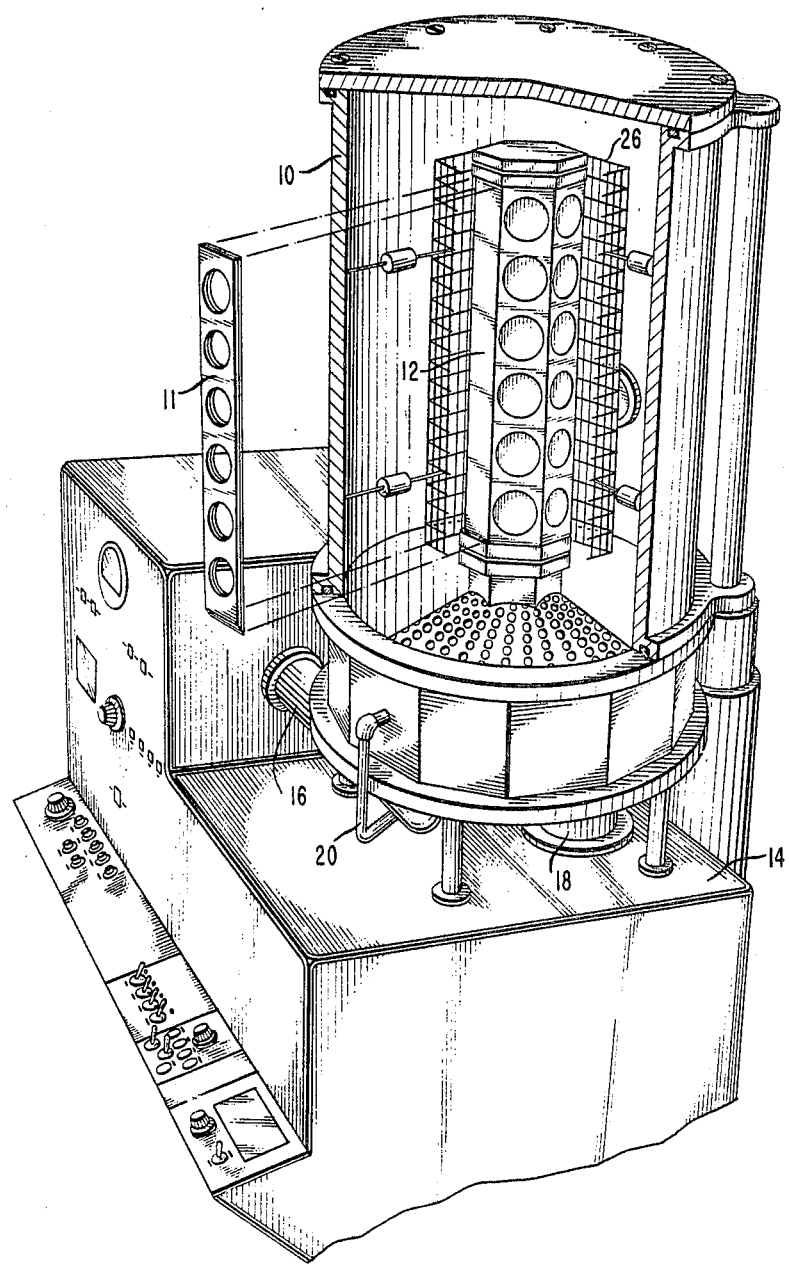
FIG. 1 shows a specific illustrative plasma-assisted etching apparatus made in accordance with the principles of the present invention.

The principles of the present invention are applicable to the improvement of both standard plasma etching equipment and methods and standard reactive sputter etching equipment and methods. Herein, for purposes of a specific illustrative example, emphasis will primarily be directed to reactive sputter etching equipment that embodies the principles of applicants' invention. It should be clearly understood, however, that these principles are also advantageously applicable to plasma etching apparatus.

Moreover, various configurations of reactive sputter etching apparatus are known. These include so-called parallel-plate or pancake reactors of the type described in U.S. Pat. No. 3,598,710 and so-called multifaceted cylindrical reactors of the type described in a copending commonly assigned U.S. patent application of D. Maydan designated Ser. No. 105,620, filed Dec. 20, 1979 now U.S. Pat. No. 4,298,443. For purposes of a specific illustrative example, emphasis herein will primarily be directed to a reactor of the multifaceted cylindrical type. But it should be clearly understood that the principles of applicants' invention are also advantageously applicable to other reactors such as those of the parallel-plate type.

A specific illustrative multifaceted reactive sputter etching apparatus that embodies applicants' inventive principles is depicted in FIG. 1. In its overall configuration, the FIG. 1 apparatus is basically the same as that described in the aforecited Maydan application. The main difference between the apparatus shown in FIG. 1 and prior such equipment attributable to others resides in the fact that surfaces in the reaction chamber of FIG. 1 are coated with a layer of silicon. For certain etching processes, to be specified later below, such a coating has been determined to impart a particularly advantageous low-contamination characteristic to the etching process carried out in the depicted reaction chamber.

As described in detail in the aforecited Maydan application, the specific illustrative etching system depicted in FIG. 1 comprises a reaction chamber defined in part by a cylindrical housing 10 made of an electrically conductive material such as, for example, aluminum or stainless steel. The housing 10 can be raised upwards to provide access to a workpiece holder 12 that is centrally mounted within the depicted structure. The particular illustrative holder 2 shown in FIG. 1 includes six flat surfaces or facets. By way of a specific example, each such surface indicated in FIG. 1 is designed to have six 4-inch wafers mounted thereon. A tray or wafer-containing assembly 11 for mounting the wafers on the holder 12 will be described below in more detail in connection with FIG. 2.

Auxiliary equipment 14 constituting a part of the overall etching system shown in FIG. 1 includes a conduit 16 that contains therein fluid-carrying pipes and a conductive bus. The fluid carried in the pipes is utilized to cool the workpiece holder 12, and the bus is for the purpose of capacitively coupling a high-frequency potential to the holder 12.

Conduit 18 (FIG. 1), which is connected to a standard vacuum pump in the equipment 14, serves to establish a prescribed low-pressure condition in the housing 10. In addition, an inlet pipe 20 is utilized to introduce a specified gas or mixture of gases into the depicted chamber from the equipment 14.

The aforementioned bus is connected to the workpiece holder 12 shown in FIG. 1, and the housing 10 is connected to a fixed point of reference potential such as electrical ground. The workpiece holder 12 constitutes the cathode and the housing 10 constitutes the anode of the depicted apparatus. As is well known, the anode-to-cathode area ratio is designed to exceed unity.

The FIG. 1 apparatus may also advantageously include a grid element 26 whose structure and function are described in detail in the aforecited Maydan application.

The wafer-mounting tray 11 of FIG. 1 is represented in more detail in FIG. 2. As indicated in FIG. 2, the tray 11 comprises a base plate 28 made, for example, of aluminum. Six wafer-holding recesses are formed in the plate 28. These recesses are typically cylindrical and just slightly larger in diameter than the respective wafers designed to be placed therein. The depth of the recesses is approximately the same as the thickness of the wafers. One such recess 30, having a wafer 32 therein, is indicated in FIG. 2. A top plate 34 containing six apertures therethrough in aligned registry with the recesses in the plate 28 is also shown in FIG. 2. Illustratively, the top plate 34 is secured to the base plate 28 by screws (one of which, designated 36, is shown in FIG. 2).

The diameter of each aperture in the top plate 34 is slightly less than the diameter of the wafer contained in the recess immediately thereunder. Accordingly, the plate 34 serves to retain the workpieces to be etched in place in the base plate 28. A major portion of the top surface of each retained workpiece is thereby exposed through its respective aperture in the plate 34. When the wafer-containing assemblies are secured in place on the facets of the holder 12, the exposed surfaces of the retained workpieces are mounted in place for etching in the apparatus of FIG. 1.

In accordance with the principles of the present invention, some or all of the internal surfaces in the reaction chamber of the FIG. 1 apparatus are coated with a layer of silicon. These surfaces include the surfaces of the top plates included in the wafer-holding assemblies (for example, the top plate 34 shown in FIG. 2), the inner surface of the housing 10 (FIG. 1), the surfaces of the grid element 26 and all other surfaces exposed to the etching plasma within the depicted reaction chamber.

To minimize contamination during etching, it is particularly important that the surfaces of the top plates included in the aforespecified wafer-holding assemblies be protectively coated. Hence, in accordance with the principles of this invention, at least the top plates of these assemblies are coated with a layer of silicon. (Of course, some or all of the other exposed surfaces in the reaction chamber may advantageously also be so coated.) Thus, as shown by way of example in FIG. 2, a layer 38 of silicon is coated on the top surface of the plate 34.

In accordance with the principles of the present invention, silicon coatings are especially well suited for use in the reaction chamber of a plasma-assisted etching apparatus designed to pattern silicon dioxide. In particular, the coatings have been determined to be particularly advantageous for patterning silicon dioxide in a specified plasma. Before, however, setting forth detailed information concerning the plasma, a specific illustrative procedure for forming suitable silicon coatings for use in the reaction chamber of a plasma-assisted etching apparatus will be described.

In accordance with the principles of this invention, silicon coatings can be applied to surfaces made, for example, of aluminum, magnesium, titanium, stainless steel, ceramic, plastic or glass. Coatings so applied, for example in accordance with the procedure detailed below, are characterized by high density, low porosity, good adherence to the underlying substrate and excellent structural integrity even under the harsh conditions typically present in the reaction chamber of a plasma-assisted etching apparatus.

An advantageous procedure followed by applicants for applying a silicon coating to substrates of the type specified above constitutes a specific version of a conventional plasma spray process. In turn, such a process is a particular form of so-called flame spraying which, as is known, is a generalized designation of methods wherein a material is brought to its melting point and sprayed onto a surface to produce a coating.

In the aforementioned plasma spray process, a direct-current (dc) potential is applied across a gap between a fluid-cooled conductive nozzle and an associated electrode. An arc is thereby produced. A plasma-generating gas comprising, for example, nitrogen or argon or nitrogen/hydrogen or argon/nitrogen or argon/hydrogen or argon/helium is directed to flow between the nozzle and the electrode of the plasma spray equipment. The arc excites the gas thereby producing a thermal plasma with temperatures adjustable up to approximately 16,000 degrees Celsius.

Powdered materials to be coated on a substrate are metered to the plasma spray equipment by a standard powder feed unit. The powder particles are introduced into the thermal plasma, melted by the high heat of the plasma and projected onto the substrate to form a coating. The molten particles impact the substrate with high force thereby producing excellent particle-to-substrate bonding.

In the plasma spray process, high thermal energy combined with high kinetic energy produce coatings of exceptional quality. For example, typical such coatings are relatively hard, dense and smooth. Though the plasma is extremely hot, the individual particles at the time of contact with the substrate are relatively cool thereby causing little, if any, dimensional distortion of the substrate and substantially preventing any chemical reaction from occurring between the impacting particles and the substrate.

FIG. 3 is a generalized schematic representation in cross-section of a specific illustrative plasma spray gun suitable for applying silicon coatings to substrates of the type mentioned above. A particular example of a commercially available such gun is the METCO 7MB plasma spray gun manufactured by METCO Inc., Westbury, Long Island, N.Y.

The gun shown in FIG. 3 comprises a conductive nozzle assembly 40. The nozzle 40 includes a passageway 42 through which fluid such as water is circulated for cooling purposes. Further, the gun includes an electrode 44 having a passageway 46 for carrying a circulating coolant.

An arc is established between the nozzle assembly 40 and the electrode 44 of FIG. 1 by applying a dc potential between terminals 48, 49. The arc is represented by ragged lines 50. A plasma-generating gas or mixture of gases is caused to flow from left to right in the depicted gun via passageway 52 to the region wherein the arc is established. The resulting plasma flame is indicated by reference numeral 54.

Silicon to be coated on substrate 56 of FIG. 3 is fed to the depicted gun via passageway 58 in the form of powdered silicon suspended in a carrier gas. Suitable such carrier gases include, for example, argon or nitrogen. METCO type 3MP plasma powder feed unit is an example of the type of standard equipment available for feeding the silicon powder to the illustrated plasma gun with high reliability.

Dashed lines 60 in FIG. 3 indicate the extent of the spray stream including silicon emanating from the plasma gun. The sprayed silicon coating deposited onto the surface of the substrate 56 is represented in FIG. 3 by reference numeral 62.

In one specific illustrative procedure for forming a silicon coating utilizing a plasma spray gun of the type represented in FIG. 3, the distance d between the exit port of the nozzle assembly 40 and the surface of the substrate 56 was maintained in the range of 4-to-21 inches. The dc potential applied between the terminals 48 and 49 was 60-to-80 volts. Silicon powder comprised of particles having diameters in the range 5-to-40 micrometers (preferably 10-to-20 micrometers) was supplied to the gun at a rate of approximately 4-to-6 pounds per hour. The carrier gas for the silicon powder was argon applied to the passageway 58 at a pressure of approximately 35-to-40 pounds per square inch. The plasma-generating gas was hydrogen/nitrogen or argon applied to the passageway 52 at a pressure of about 80 pounds per square inch.

Illustratively, the starting point for providing powder to be applied to the FIG. 3 plasma spray gun comprises pieces of monocrystalline or polycrystalline silicon. Hammer milling and then successive screening of such pieces are effective to provide the powder required for application to the FIG. 3 gun.

In accordance with the procedures set forth above, silicon coatings of various thicknesses can be deposited on a variety of substrates. In practice, the deposited coating has been made as thin as approximately 1-to-5 micrometers. Coatings approximately 0.4 millimeters thick have also been made. For one specific illustrative reactive sputter etching apparatus in which surfaces in the reaction chamber were coated with silicon, the coating thickness was advantageously established at approximately 175 micrometers.

In one specific illustrative coating procedure in which aluminum surfaces are coated with silicon, the aluminum surfaces are advantageously initially cleaned. This is done, for example, by glass-bead frit blasting the surfaces and then cleaning them with trichloroethylene.

Applicants have discovered that silicon coatings of the type specified above are particularly well suited for use in the reaction chamber of a plasma-assisted apparatus designed to pattern silicon dioxide. In practice, such coatings have been determined to produce very little, if any, contamination of VLSI wafers during dry etching of silicon dioxide layers.

More specifically, in accordance with the principles of the present invention, silicon coatings have been found to be advantageous for inclusion in the reaction chamber of a reactive sputter etching apparatus during patterning of a silicon dioxide layer in a plasma derived from a mixture of trifluoromethane and ammonia gases.

In one specific illustrative example in which a silicon dioxide layer was anisotropically etched in a chamber that included surfaces coated with silicon, the aforementioned gas mixture included 96 percent by volume trifluoromethane and 4 percent of volume ammonia. (Trifluoromethane percentages in the range 100-to-85 percent and ammonia percentages in the range 0-to-15 also provide satisfactory results.) The flow of the mixture into the chamber approximated 30 cubic centimeters per minute. (A flow in the range 5-to-70 cubic centimeters per minute is satisfactory.) The pressure in the chamber was maintained at about 50 micrometers. (Satisfactory operation may also be carried out at a pressure in the range 5-to-100 micrometers.) The power per square centimeter at the surface to be etched was established at approximately 0.16 watts per square centimeter. (A power density in the range 0.1-to-0.3 watts per square centimeter is satisfactory.) The direct-current bias of the cathode or wafer-holding electrode with respect to ground was measured to be about 600 volts. (A bias voltage in the range 400-to-800 volts dc is satisfactory.) Under these particular conditions, a one-micrometer-thick silicon dioxide layer was anisotropically etched in a substantially contamination-free manner at a rate of approximately 300 Angstrom units per minute.

Finally, it is to be understood that the abovedescribed arrangements and procedures are only illustrative of the principles of the present invention. In accordance with these principles, numerous modifications and alternatives may be devised by those skilled in the art without departing from the spirit and scope of the invention.

In a related application being filed concurrently herewith, applicants are disclosing and claiming a different material for coating surfaces in the reaction chamber of a plasma-assisted apparatus to achieve low-contamination etching of specified layers. This related application is designated, Ser. No. 295,531.

What is claimed is:

1. Apparatus for low-contamination plasma-assisted dry etching of a layer of silicon dioxide formed on a wafer, said apparatus comprising
   a reaction chamber,
   means for establishing within said chamber an etching plasma derived from a mixture of trifluoromethane and ammonia gases,
   said chamber including surfaces exposed to said plasma,
   and a coating of silicon on at least the surfaces in the immediate vicinity of said layer to be etched.

2. An apparatus as in claim 1 wherein said coating comprises individual particles of monocrystalline or polycrystalline silicon fused together on said surfaces in a plasma spraying process.

3. An apparatus as in claim 2 further including a cathode electrode in said reaction chamber,
   and means mounting said wafer on said cathode electrode.

4. An apparatus as in claim 3 wherein said establishing means includes means for establishing the following conditions in said reaction chamber: a pressure of approximately 50 micrometers, a power density of approximately 0.16 watts per square centimeter at the surface of the layer to be etched, a gas flow into said chamber of approximately 96 volume percent trifluoromethane and 4 volume percent ammonia, a gas flow into said chamber of approximately 30 cubic centimeters per minute and a dc bias voltage of said cathode electrode with respect to a point of reference potential of approximately 600 volts.

5. Apparatus for low-contamination plasma-assisted dry etching of a layer of silicon dioxide on a wafer that is to be processed to form multiple integrated circuits, said apparatus comprising
   a reaction chamber,
   means for establishing within said chamber an etching plasma derived from a mixture of trifluoromethane and ammonia,
   means within said chamber for holding a number of wafers to be etched,
   said chamber having internal surfaces including surfaces of said holding means in the immediate vicinity of said wafers to be etched,
   and a coating of silicon formed on internal surfaces including at least the surfaces of said holding means in the immediate vicinity of said wafers.

6. A method for fabricating VLSI devices by delineating fine-line patterns in a layer of silicon dioxide on a wafer in accordance with a process sequence that includes low-contamination plasma-assisted dry etching, said method comprising the steps of
   mounting said wafer to be etched in a reaction chamber at least some of whose surfaces, including surfaces in the immediate vicinity of said layer to be etched, are coated with a layer of silicon,
   introducing a mixture of trifluoromethane and ammonia gases into said reaction chamber,
   and establishing an etching plasma within said chamber.

7. A method as in claim 6 wherein a cathode electrode is included in said reaction chamber and said wafer to be etched is mounted on said cathode electrode.

8. A method as in claim 7 wherein said establishing step includes establishing the following conditions in said reaction chamber: a pressure of approximately 50 micrometers, a power density of approximately 0.16 watts per square centimeter at the surface of the layer to be etched, a gas flow into said chamber of approximately 96 volume percent trifluoromethane and 4 volume percent ammonia, a gas flow into said chamber of approximately 30 cubic centimeters per minute and a dc bias voltage of said cathode electrode with respect to a point of reference potential of approximately 600 volts.

9. Apparatus for low-contamination plasma-assisted dry etching of a layer of silicon dioxide formed on a water, said apparatus comprising
   a reaction chamber,
   means for establishing within said chamber an etching plasma derived from trifluoromethane,
   said chamber including surfaces exposed to said plasma,
   and a coating of silicon on at least the surfaces in the immediate vicinity of said layer to be etched.

10. An apparatus as in claim 9 wherein said coating comprises individual particles of monocrystalline or polycrystalline silicon fused together on said surfaces in a plasma spraying process.

11. An apparatus as in claim 10 further including a cathode electrode in said reaction chamber,
    and means mounting said wafer on said cathode electrode.

12. Apparatus for low-contamination plasma-assisted dry etching of a layer of silicon dioxide on a wafer that is to be processed to form multiple integrated circuits, said apparatus comprising
    a reaction chamber,
    means for establishing within said chamber an etching plasma derived from trifluoromethane,
    means within said chamber for holding a number of wafers to be etched,
    said chamber having internal surfaces including surfaces of said holding means in the immediate vicinity of said wafers to be etched,
    and a coating of silicon formed on internal surfaces including at least the surfaces of said holding means in the intermediate vicinity of said wafers.

13. A method for fabricating VLSI devices by delineating fine-line patterns in a layer of silicon dioxide on a wafer in accordance with a process sequence that includes low-contamination plasma-assisted dry etching, said method comprising the steps of
    mounting said wafer to be etched in a reaction chamber at least some of whose surfaces, including surfaces in the immediate vicinity of said layer to be etched, are coated with a layer of silicon,
    introducing trifluoromethane gas into said reaction chamber,
    and establishing an etching plasma within said chamber.

14. A method as in claim 13 wherein a cathode electrode is included in said reaction chamber and said wafer to be etched is mounted on said cathode electrode.

* * * * *